(12) United States Patent
Zhang

(10) Patent No.: US 9,093,802 B2
(45) Date of Patent: Jul. 28, 2015

(54) ELECTRICAL CONNECTOR WITH LATCHES TO AUTOMATIC LOCK ELECTRONIC PACKAGE

(71) Applicant: HON HAI PRECISION INDUSTRY CO., LTD., New Taipei (TW)

(72) Inventor: Jie-Feng Zhang, Shenzhen (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/142,931

(22) Filed: Dec. 30, 2013

(65) Prior Publication Data

US 2014/0187074 A1    Jul. 3, 2014

(30) Foreign Application Priority Data

Dec. 28, 2012   (CN) .......................... 2012 1 0582452

(51) Int. Cl.
  *H01R 13/62*   (2006.01)
  *H01R 12/88*   (2011.01)
  *H01R 13/639*   (2006.01)

(52) U.S. Cl.
  CPC .............. *H01R 12/88* (2013.01); *H01R 13/639* (2013.01)

(58) Field of Classification Search
  USPC ........................................... 439/331
  See application file for complete search history.

(56) References Cited

U.S. PATENT DOCUMENTS

| 6,916,195 B2 * | 7/2005 | Byquist ......................... 439/342 |
| 6,927,981 B1 | 8/2005 | Kao |
| 7,001,197 B2 * | 2/2006 | Shirai et al. .................... 439/331 |
| 7,070,436 B2 * | 7/2006 | Chin ............................. 439/342 |
| 7,163,406 B2 * | 1/2007 | Ma ................................. 439/70 |
| 7,179,092 B2 * | 2/2007 | Ma ................................. 439/73 |
| 7,878,838 B1 * | 2/2011 | French et al. ................. 439/331 |

FOREIGN PATENT DOCUMENTS

| CN | 2842789 | 11/2006 |
| TW | M364294 | 9/2009 |

* cited by examiner

*Primary Examiner* — Jean F Duverne
(74) *Attorney, Agent, or Firm* — Wei Te Chung; Ming Chieh Chang

(57) ABSTRACT

An electrical connector includes an electrical connector used for locking an electronic package, comprises an insulative base having a plurality of contacts. A cover is mounted upon the base. An active device is mounted between the base and the cover for driving the cover moving horizontally along the base in an open position and a closed position. The cover and the base respectively have a first latch and a second latch disposed in a direction moving by the cover for locking the electronic package.

9 Claims, 4 Drawing Sheets

ELECTRICAL CONNECTOR WITH LATCHES TO AUTOMATIC LOCK ELECTRONIC PACKAGE

BACKGROUND OF THE INVENTION

1. Field of the invention

The present invention relates to an electrical connector, and more particularly to the electrical connector with latches to automatic lock an electronic package mounted to the electrical connector.

2. Description of Related Art

Chinese patent publication No. 2842789 issued to Zhu on Nov. 29, 2006 discloses an electrical connector used for connecting a package. The electrical connector is a Pin Gray Array (PGA) type connector which comprises an insulative base receiving a plurality of contacts, a cover mounted upon the base, and a lever driving the cover horizontally moved along the base. An electronic package is mounted upon an upper surface of the cover so that a plurality of terminal pins insert into the cover and electrically connect with the contacts of the base. The clamping force of the contacts acted between the electronic package and the electrical connector maybe not reliable to hold the electronic package during shock and vibration tests.

Therefore, an improved electrical connector is needed.

SUMMARY OF THE INVENTION

An object of the present invention is to provide an electrical connector with latches to automatic lock an electronic package mounted to the electrical connector.

According to one aspect of the present invention, an electrical connector used for locking an electronic package, comprises an insulative base having a plurality of contacts. A cover is mounted upon the base. An active device is mounted between the base and the cover for driving the cover moving horizontally along the base in an open position and a closed position. The cover and the base respectively have a first latch and a second latch disposed in a direction moving by the cover for locking the electronic package.

According to another aspect of the present invention, an electrical connector used for locking an electronic package, comprises an insulative base having a plurality of contacts. A cover is mounted upon the base and has an open position and a closed position respective to the base. A first latch is disposed on the cover for locking a first end of the electronic package when the cover located at the open position. A second latch is disposed on the base for locking a second end opposite to the first end when the cover located at the closed position.

Other objects, advantages and novel features of the invention will become more apparent from the following detailed description of a preferred embodiment when taken in conjunction with the accompanying drawings.

DETAILED DESCRIPTION OF THE INVENTION

Figure 1:
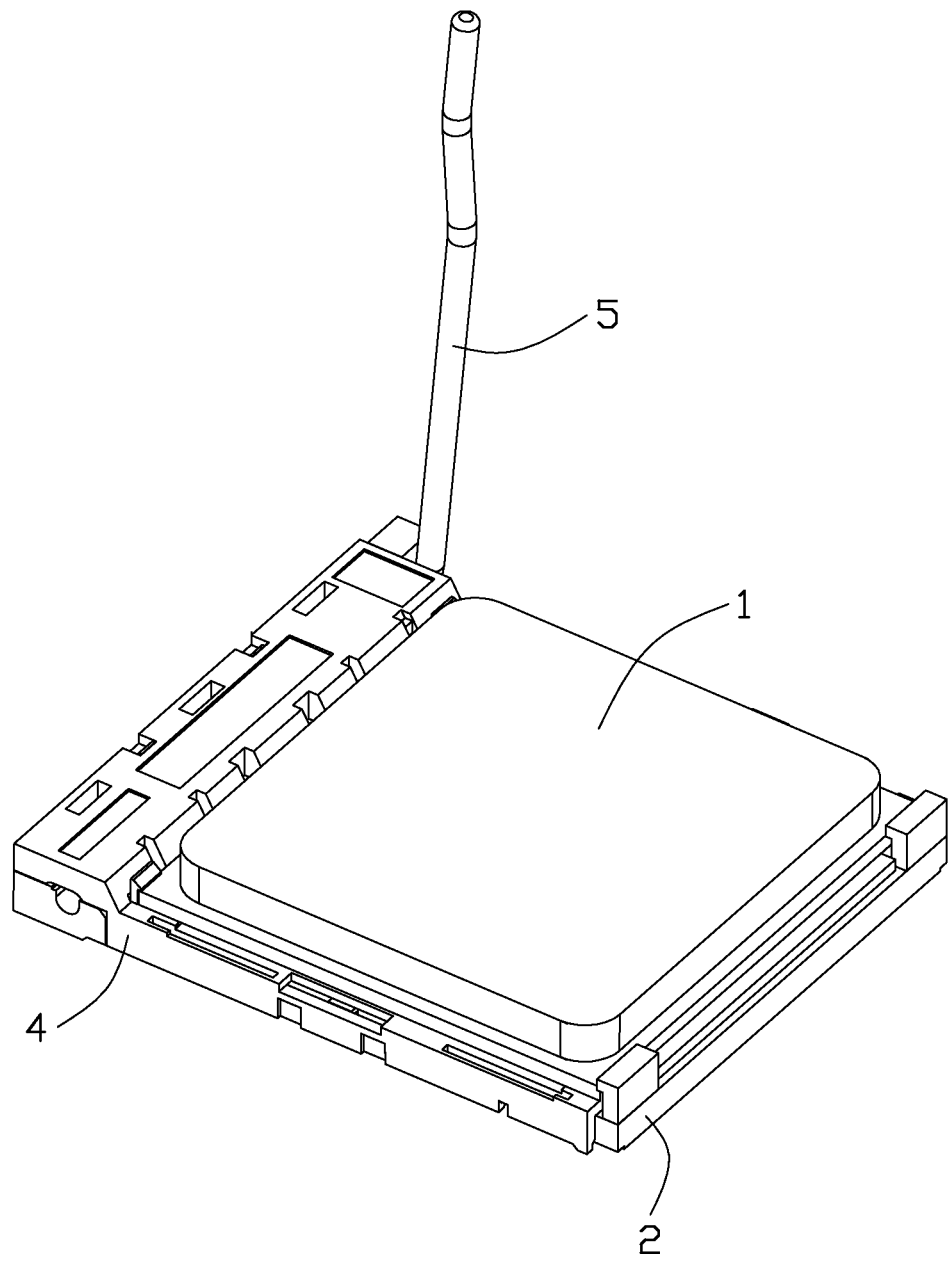
FIG. 1 is an assembled, perspective view of an electrical connector assembled with an electronic package in accordance with the present invention.

Referring to FIGS. 1 to 4, an electrical connector used for electrically connecting an electronic package 1 and a printed circuit board (PCB, not shown), comprises a base 2, a plurality of contacts 3 received in the base 2, a cover 4, and the active device 5.

Figure 2:
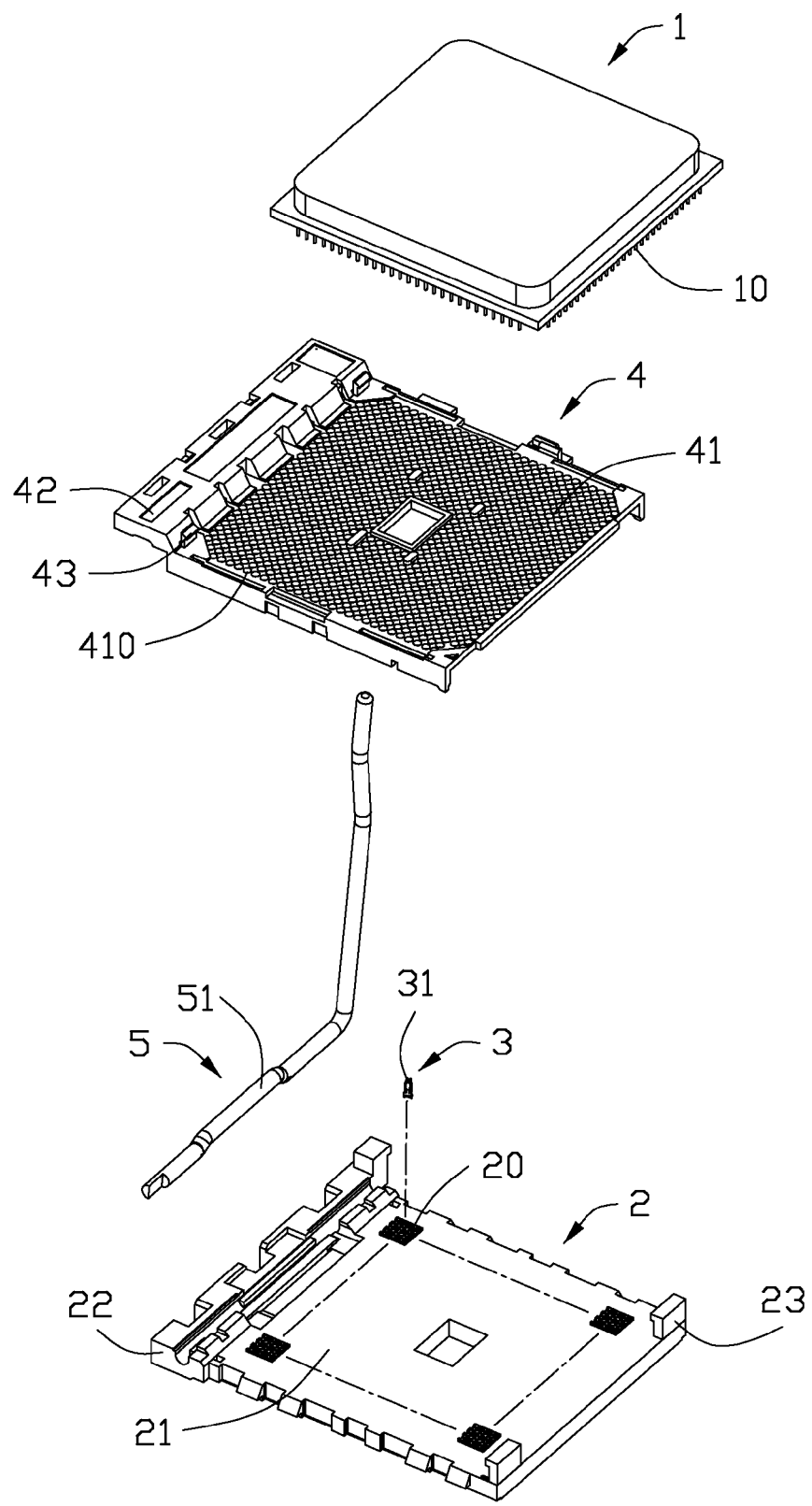
FIG. 2 is an exposed, perspective view of the electrical connector and the electronic package shown in FIG. 1.

Referring to FIGS. 1 and 2, the base 2 has a rectangular shape. The base 2 includes an accommodating area 21 defining a plurality of passageways 20 and an end portion 22 positioned at one end of the accommodating area 21. The contacts 3 are received in the passageways 20.

The cover 4 latches to the base 2 and can be horizontally moved with regard to the base 2 in an open position and a closed position. In the open position, the electronic package 1 is mounted to the cover 4 and in the closed position, the electronic package 1 is held by the contacts 3. The cover 4 includes a supporting area 41 corresponding to the accommodating area 21 and a head portion 42 located at on end of the supporting area 41 corresponding to the end portion 22. The supporting area 41 defines a plurality of through holes 410 corresponding to the passageways 20 of the base 2 to allow pins 10 of the electronic package 1 to insert into mating arms 31 of the contacts 3 such that establish an electrical connection between the electronic package 1 and the electrical connector. The active device 5 is received in a receiving portion which is defined between the end portion 22 of the base 2 and the head portion 42 of the cover 4. In this embodiment, the active device 5 is a lever with a driving portion 51 driving the cover 4 moving with regard to the base 2.

Figure 3:
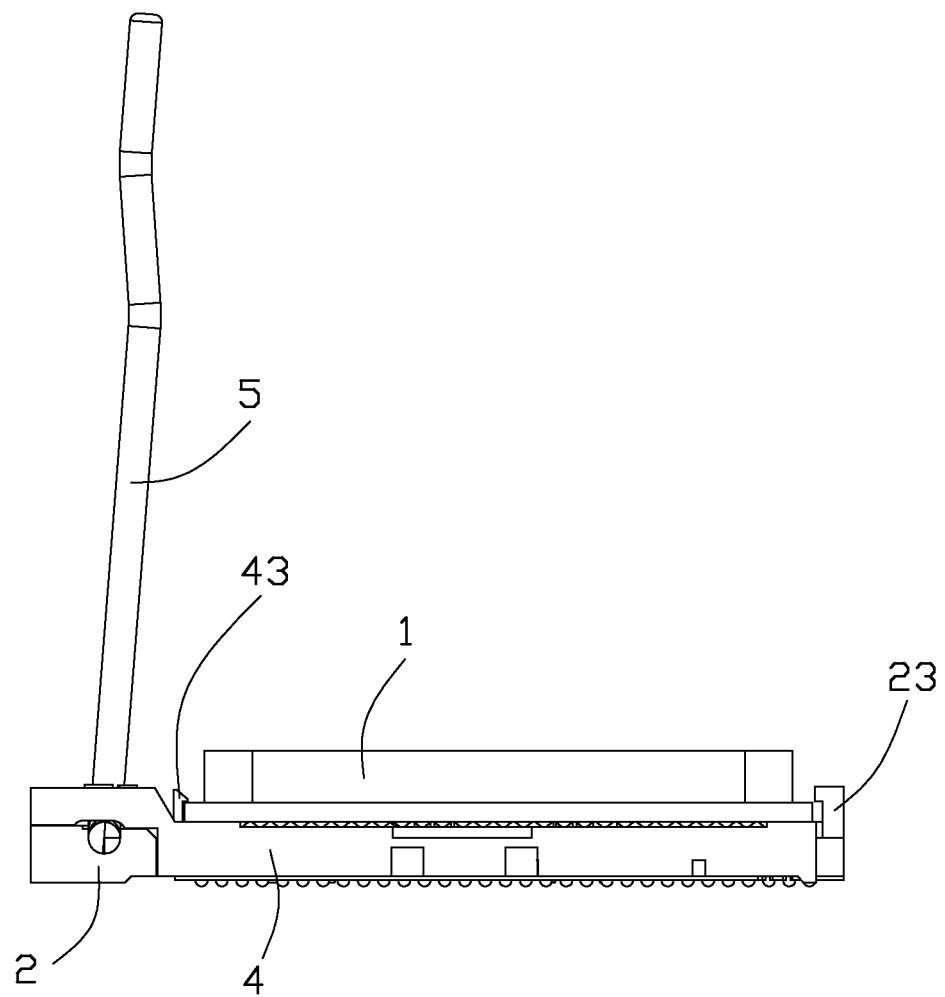
FIG. 3 is a side view of FIG. 1, wherein an active is at an open position and the electronic package initially mounted to the electrical connector.
Figure 4:
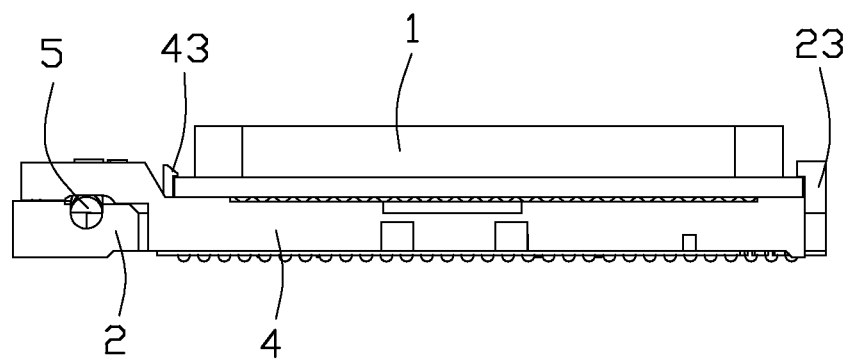
FIG. 4 is a side view similar to FIG. 3, wherein the active device is at a closed position and the electronic package finally mounted to the electrical connector.

The cover 4 has a first latch 43 disposed at a side of the supporting area 41 adjacent the head portion 42 and the base 2 has a second latch 23 disposed at a side of the accommodating area 21 far away the end portion 22. The first latch 43 and the second latch 23 are disposed in a direction the cover 4 moved so that to lock the electronic package 1. The second latch 23 extends upwardly from the base 2 and higher than a top surface of the cover 4. Referring to FIG. 3, when the electrical connector located at the open position, the through holes 410 of the cover 4 align with the passageways 20 of the base 2 so that the electronic package 1 is mounted on the cover 4, while the first latch 43 attaches corresponding end of the electronic package 1. After that, the active device 5 drives the cover 4 moving to the closed position and the electronic package 1 also is be moved to the closed position. Referring to FIG. 4, when the electrical connector located at the closed position, the electronic package 1 is inserted into the second latch 23 and latched by second latch 23.

In this embodiment, the distance between the first latch 43 and the second latch 23 gradually become shorten when the electrical connector is moved from the open position to the closed position such that the electronic package 1 is automatic locked by the first latch 43 and the second latch 23.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector used for locking an electronic package, comprising:
    an insulative base having a plurality of contacts;

a cover mounted upon the base;

an active device mounted between the base and the cover for driving the cover moving horizontally along the base in an open position and a closed position; and wherein the cover and the base respectively have a first latch and a second latch disposed in respective directions for locking the electronic package; wherein the base includes an accommodating area and an end portion connecting with the accommodating area, wherein the second latch disposed at a side of the accommodating area far way the end portion; wherein the cover includes a supporting portion corresponding to the accommodating area and a head portion connecting with the supporting portion, wherein the first latch disposed at a side of the supporting portion near the head portion; wherein the distance between the first latch and the second latch in the open position is larger than in the closed position.

2. The electrical connector as claimed in claim 1, wherein the first latch and the second latch have a same height upon a top surface of the cover.

3. The electrical connector as claimed in claim 1, wherein the active device is a lever, which includes a driving portion to drive the cover moving.

4. An electrical connector used for locking an electronic package, comprising:

an insulative base having a plurality of contacts;

a cover mounted upon the base and having an open position and a closed position respective to the base;

a first latch disposed on the cover for locking a first end of the electronic package when the cover located at the open position;

a second latch disposed on the base for locking a second end of the electronic package, which is opposite to the first end, when the cover located at the closed position; further including an active device assembled between the base and the cover to drive the cover horizontally moving with regard to the base between the open position and the close position; wherein the first latch extends from the cover and the second latch extends from the base; wherein the first latch and the second latch are located in a direction the cover moved.

5. An electrical connector assembly for use with an electronic package which defines opposite locking end regions along a front-to-back direction, comprising:

an insulative housing including an insulative base with an insulative cover stacked thereon;

said base defining a plurality of passageways in matrix;

a plurality of contacts disposed in the corresponding passageways, respectively;

said cover mounted upon the base and moveable relative to the base along said front-to-back direction between opposite open and locking positions whereby the electronic package is adapted to be mounted upon and moveable along with the cover in said front-to-back direction;

a plurality of through holes defined in the cover in alignment with the corresponding passageways, respectively; and opposite first and second latches located at two opposite ends of the housing in said front-to-back direction; wherein the first latch is dimensioned and configured for vertically locking one of said two opposite end regions of an electronic package at least when the cover is moved to the closed position, and the second latch is dimensioned and configured for vertically locking the other of said opposite two locking end regions of the electronic package only when said cover is moved to the locked position.

6. The electrical connector assembly as claimed in claim 5, wherein the first latch is formed on the cover and the second latch is formed on the base.

7. The electrical connector assembly as claimed in claim 6, wherein said first latch constantly vertically locks the electronic package as long as the electronic package is mounted upon the cover.

8. The electrical connector assembly as claimed in claim 6, wherein said first latch is resilient while said second latch is stiff.

9. The electrical connector assembly as claimed in claim 5, wherein a lever is sandwiched between the cover and the base to actuate the cover to move.

\* \* \* \* \*